United States Patent
Czaplewski-Campbell et al.

(10) Patent No.: US 12,389,547 B2
(45) Date of Patent: Aug. 12, 2025

(54) HYBRID MECHANICAL DRILL

(71) Applicant: International Business Machines Corporation, Armonk, NY (US)

(72) Inventors: Sarah K. Czaplewski-Campbell, Rochester, MN (US); Eric J. Campbell, Rochester, MN (US); Jennifer I. Bennett, Rochester, MN (US); Steven Chandler Borrillo, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 1244 days.

(21) Appl. No.: 17/142,898

(22) Filed: Jan. 6, 2021

(65) Prior Publication Data

US 2022/0212282 A1 Jul. 7, 2022

(51) Int. Cl.
| | | |
|---|---|---|
| *H05K 3/00* | (2006.01) | |
| *B23K 26/00* | (2014.01) | |
| *B23K 26/382* | (2014.01) | |
| *H05K 3/02* | (2006.01) | |
| *H01S 3/16* | (2006.01) | |
| *H01S 3/223* | (2006.01) | |

(52) U.S. Cl.
CPC ....... *H05K 3/0035* (2013.01); *B23K 26/0093* (2013.01); *B23K 26/382* (2015.10); *H05K 3/0047* (2013.01); *H05K 3/027* (2013.01); *H01S 3/1643* (2013.01); *H01S 3/2232* (2013.01)

(58) Field of Classification Search
CPC .............. B23K 26/0093; B23K 26/382; H05K 3/0035; H05K 3/0047; H05K 2203/02; H05K 2203/0207
See application file for complete search history.

(56) References Cited

U.S. PATENT DOCUMENTS

| | | | | |
|---|---|---|---|---|
| 4,596,067 A | * | 6/1986 | Raiteri | H05K 3/0047 |
| | | | | 408/46 |
| 5,010,232 A | * | 4/1991 | Arai | H05K 3/0035 |
| | | | | 219/121.7 |
| 6,353,999 B1 | | 3/2002 | Cheng | |
| 7,147,064 B2 | | 12/2006 | Batarseh | |
| (Continued) | | | | |

FOREIGN PATENT DOCUMENTS

| | | | | | |
|---|---|---|---|---|---|
| JP | 04289038 A | * | 10/1992 | ......... | B23K 26/0093 |

OTHER PUBLICATIONS

Mell et al., "The NIST Definition of Cloud Computing," Recommendations of the National Institute of Standards and Technology, U.S. Department of Commerce, Special Publication 800-145, Sep. 2011, 7 pgs.

*Primary Examiner* — Livius R. Cazan
(74) *Attorney, Agent, or Firm* — Shackelford, McKinley & Norton, LLP

(57) ABSTRACT

A system and method for making vias in a laminated printed circuit board (PCB). A drill having both a mechanical drill and a laser drill is used to make the via. The mechanical drill is moved over a location in the PCB where a blind via is desired. The mechanical drill drills to a point where a tip of a bit of the mechanical drill is a predetermined distance above a target interconnect layer. Then the drill is moved such that the laser drill is located over the via where the mechanical drill had drilled the via. The laser drill then ablates the resin remaining above the target interconnect layer.

15 Claims, 5 Drawing Sheets

(56) References Cited

U.S. PATENT DOCUMENTS

| | | |
|---|---|---|
| 7,257,879 B1 | 8/2007 | Alex |
| 8,847,114 B1 | 9/2014 | Shin |
| 8,933,366 B2 | 1/2015 | Patten |
| 9,074,422 B2 | 7/2015 | Grubb |
| 9,364,931 B2 | 6/2016 | Chuang |
| 10,183,337 B2 | 1/2019 | Patten |
| 2004/0048050 A1* | 3/2004 | Cassat .................. H05K 3/4661 428/209 |
| 2012/0261188 A1 | 10/2012 | Zediker |
| 2018/0114703 A1 | 4/2018 | Karni |

\* cited by examiner

HYBRID MECHANICAL DRILL

BACKGROUND

The present disclosure relates to forming vias in a printed circuit board, more specifically to using a drill having both a mechanical drill and laser drill on the same arm to drill the via.

There are two different approaches that are used for creating blind vias in a printed circuit board. The first approach uses laser drills to create blind vias but feasible depth of the via into the printed circuit board is limited or sequential lamination is required. The second approach uses mechanical drills to create blind vias over any number of layers. Mechanically drilled blind vias can cause electrical clearance issues because the tip of the drill bit can penetrate the target layer and encroach on the layer underneath.

SUMMARY

According to embodiments of the present disclosure a method for making vias in a laminated printed circuit board (PCB) is discussed. A drill having both a mechanical drill and a laser drill is used to make the via. The mechanical drill is moved over a location in the PCB where a blind via is desired. The mechanical drill drills to a point where a tip of a bit of the mechanical drill is a predetermined distance above a target interconnect layer. Then the drill is moved such that the laser drill is located over the via where the mechanical drill had drilled the via. The laser drill then ablates the resin remaining above the target interconnect layer. According to embodiments, a system for drilling vias in a printed circuit board is discussed. The system includes a laminated printed circuit board having a plurality of layers and a drill, with both a mechanical drill and a laser drill on the same drill arm. The system further includes a control unit connected to the drill. The control unit is configured to move the mechanical drill to a location of the PCB where a via is desired. The control unit then causes the drill to use the mechanical drill to drill to a point where a tip of a bit of the mechanical drill is a predetermined distance above a target interconnect layer. The control unit then moves the drill such that the laser drill is located over the via where the mechanical drill had drilled the via, and applies the laser drill to ablate resin remaining above the target interconnect layer.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
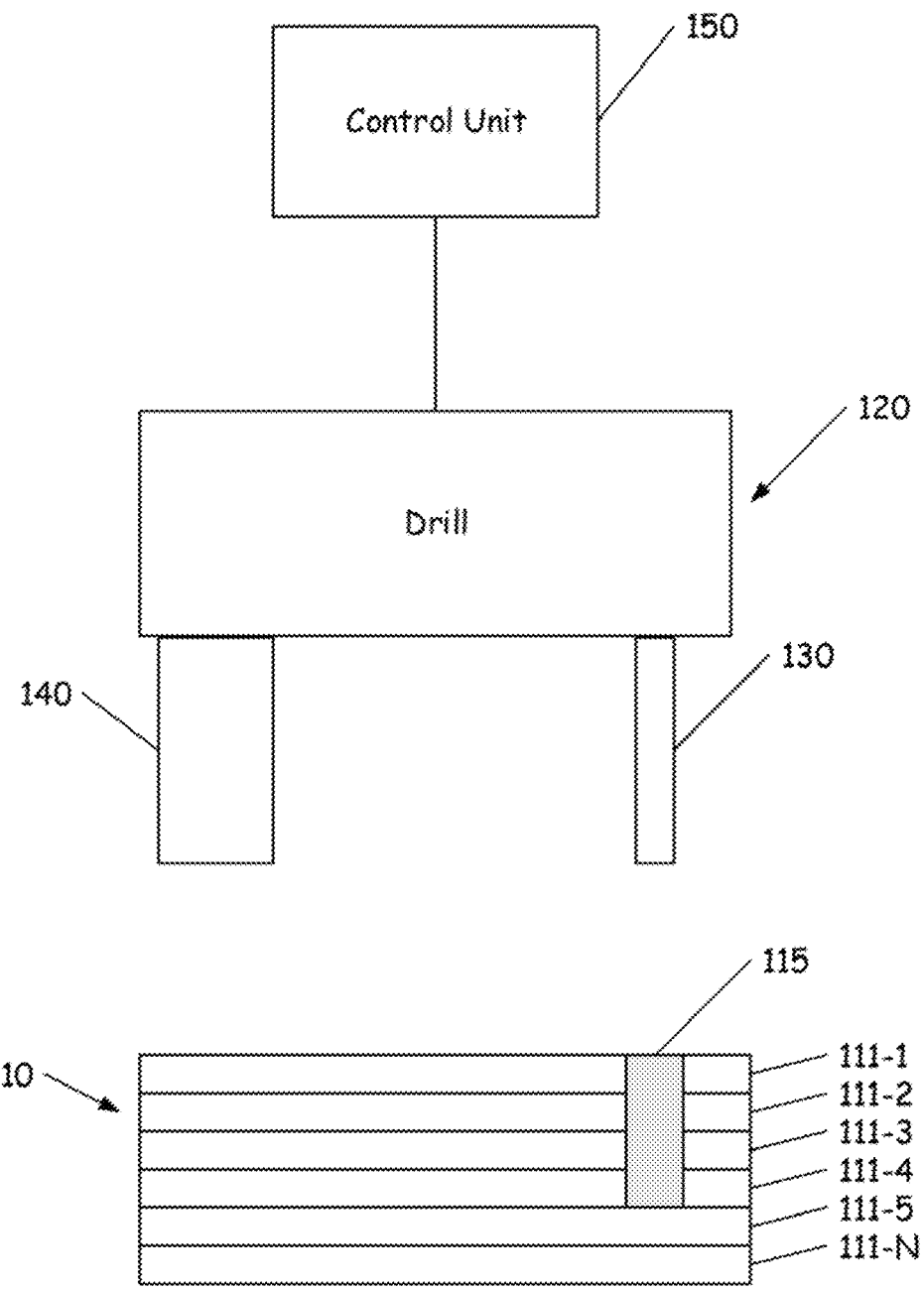
FIG. 1 is diagrammatic illustration of a system for creating blind vias in a printed circuit board according to illustrative embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relates to forming vias in a printed circuit board, more specifically to using a drill having both a mechanical drill and laser drill on the same arm to drill the via. While the present disclosure is not necessarily limited to such applications, various aspects of the disclosure may be appreciated through a discussion of various examples using this context.

There are two different approaches that are used for creating blind vias in a printed circuit board. The first approach uses laser drills to create blind vias between only a few layers of the printed circuit board. The second approach uses mechanical drills to create blind vias over any number of layers. Both of these methods have drawbacks in the creation of the blind via 115.

Laser drilled vias use either CO2 and/or YAG (Yttrium-Aluminum Garnet) lasers to create the hole. CO2 lasers vaporize resin and the glass fibers. YAG lasers will vaporize the resin, glass, and copper. If only a YAG drill is used it is hard to control the depth of the hole since the YAG laser will ablate all of the material in the PCB. If only a CO2 laser is used, the depth of the hole is limited to 1 layer thick. Because of this, lasers are typically used for holes that are only a few layers deep. Connecting deeper layers using laser drilled vias and would require multiple PCB laminations.

Mechanically drilled blind vias can cause electrical clearance issues because the tip of the drill bit can penetrate the target layer and encroach on the layer underneath.

FIG. 1 is diagrammatic illustration of a system for creating blind vias in a printed circuit board according to illustrative embodiments of the present disclosure. System 100 includes a printed circuit board 110, a drill 120, and a control unit 150.

The printed circuit board 110 includes a plurality of layers 111-1, 111-2, 111-3, 111-4, 111-5, . . . 111-N (collectively layers 111). These layers include both interconnect layers and dielectric layers. The printed circuit board 110 is laminated using conventional processes for manufacturing printed circuit boards. Each of the layers 111 may be composed of a different material. In some embodiments, the interconnection layers are made from copper Cu. However, the interconnect layers can be made of copper plated with gold, nickel, silver, tin, or conductive carbon, such as graphite. The dielectric layer can be made of a polymer. The polymers are epoxy based, PPO-based, or polyimide based. In some embodiments the dielectric layer includes glass disposed within the layer.

Drill 120 is a component of the system that is configured to drill blind vias into the printed circuit board 110. The drill 120 includes both a mechanical drill 130 and a laser drill 140 on the same drill arm. The mechanical drill 130 and the laser drill 140 are attached to the drill arm with a drill 120 platform that is configured to rotate around an axis. During the drilling process the drill arm rotates around the axis such that the mechanical drill 130 and the laser drill 140 are able to bore the same hole without the need to move the drill arm to a new position. However, in some embodiments, the mechanical drill 130 and the laser drill 140 do not rotate around the axis. In these embodiments, the drill 120 is programmed to move the mechanical drill 130 and the laser drill 140 to the same location above the printed circuit board 110 so that the mechanical drill 130 and laser drill 140 are able to drill in the same via 115.

The mechanical drill 130 is configured to drill the via 115 using conventional drilling methods. Typically, a drill 120 bit is attached to the end of a rotating drill chuck which converts the rotational energy of the drill's motor to spin the drill bit. The drill bit then proceeds to remove material from the PCB by boring into the material and removing the material through spinning action and processing the material through an auger built into the drill 120.

The laser drill 140 is configured to drill the via 115 using a laser. The laser drill 140 creates thru-holes by repeatedly pulsing focused laser energy on a material, such as the PCB. The diameter of these holes can be as small as 0.002 inches (~50 μm). If a larger hole is desired, the laser is moved around the circumference of the hole until the desired diameter is created. The laser drill 140 can use a CO2 laser to remove the laminate material of the PCB, above the interconnect layer. In some embodiments, the laser drill 140 includes a YAG laser that is used to clean the surface of the interconnect layer following the use of the CO2 laser. The CO2 laser and YAG laser can be different heads of the drill 120. However, in some embodiments the CO2 laser and the YAG laser share the same head of the drill 120.

The control unit 150 is a component of the system that is configured to operate the drill 120 during the drilling process for the blind via 115. The control unit 150 uses information about the particular PCB and the desired properties of the via 115 to control the use of the mechanical drill 130 and the laser drill 140. The control unit 150 will cause the mechanical drill 130 to be used to drill through the material until it reaches a point in the laminate layer just above a target plane or layer of the PCB. The control unit 150 is then configured to remove the mechanical drill 130 from the via 115, and cause the laser drill 140 to be positioned over the via 115. The control unit 150 then causes the laser drill 140 to remove the remaining laminate material above the target interconnect layer. In some embodiments the control unit 150 is integrated into the drill 120. However, in some embodiments the control unit 150 is located separately from the drill 120. In some embodiments the control unit 150 is hosted in the cloud and connects with the drill 120 through a network.

Figure 2:
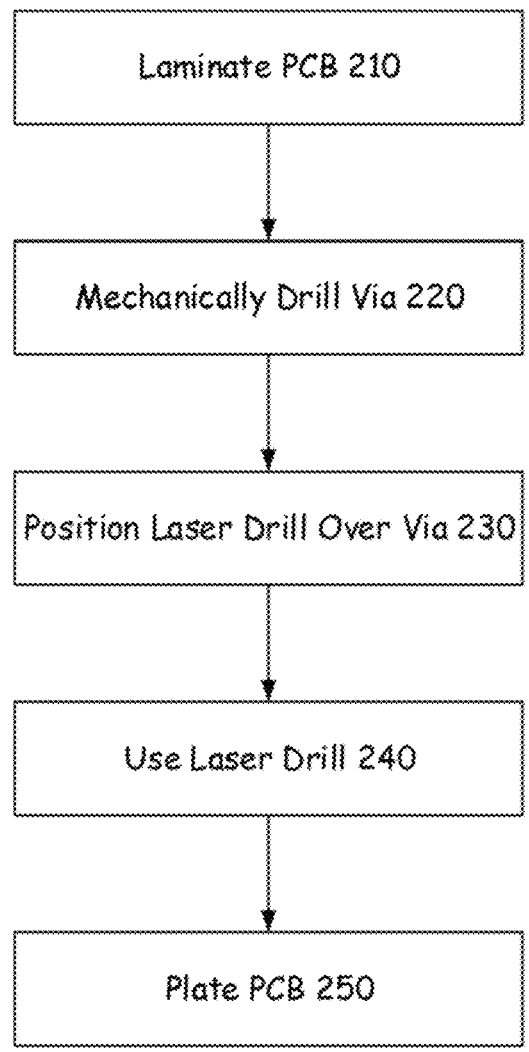
FIG. 2 is a flow diagram illustrating a process for drilling a blind via 115 according to embodiments.

FIG. 2 is a flow diagram illustrating a process for drilling a blind via 115 according to embodiments of the present disclosure. The process begins by laminating a PCB. This is illustrated at step 210. The process for laminating the PCB can be done using any known process for laminating a PCB, such as stacking-up alternating layers of prepreg (b-stage or incompletely cured laminate material) and cores (copper clad cured laminate material) and then placing them in a press and applying pressure and heat. However, in some embodiments the process can begin by receiving an already laminated PCB. This received PCB card can be one that is made by the group that is drilling the blind vias, or can be one that was received from an outside vendor.

Once the laminated PCB has been received at the drill 120 the PCB is placed in a location so that the blind vias can be formed. Once in the proper location the mechanical portion of the drill 120 is aligned over the area where the blind via 115 will be. The mechanical drill 130 then proceeds to drill the blind via 115. This is illustrated at step 220. While the mechanical portion of the drill 120 is drilling the via 115, the control unit 150 is monitoring the depth of the drill bit. When the drill bit has reached a point just above the target interconnect layer the control unit 150 causes the mechanical drill 130 to stop further mechanical drilling. This point is selected by the control unit 150 such that point of the drill bit does not contact or remove any of the material of the interconnect layer.

Once the control unit 150 has stopped the mechanical drill 130 from drilling the mechanical drill 130 is removed from the via 115. The control unit 150 then moves the laser drill 140 into place over the blind via 115. This is illustrated at step 230. In some embodiments, the control unit 150 causes the drill 120 to rotate the head, such that the mechanical drill 130 rotates away from the via 115, and the laser drill 140 head rotates into position over the via 115. In other embodiments, the drill heads move from a first position to a second position such that the mechanical drill 130 moves away from the via 115 and the laser drill 140 moves over the via 115.

Once the laser drill 140 is in position over the via 115, the laser drill 140 is activated to finish off the drilling the via 115. This is illustrated at step 240. In some embodiments, a CO2 laser is used to ablate the remaining resin material above the interconnect layer. In some embodiments, a YAG laser can be applied to the via 115 to clean any remaining material on the interconnect layer. In some embodiments, when the YAG laser is applied to the via 115, the first laser drill 140 is moved from over the via 115 and the YAG laser is moved into place by rotating the YAG laser over the via 115.

Following the drilling process, the PCB is plated. This is illustrated at step 250. The process of plating can be electroless or can use electroplating. Electroless plating does not require electricity, but requires a catalyst for deposition of the plating material on the PCB. Electroplating uses electrolysis whereby a DC current to dissolve a conductive metal and distributes that metal over the surfaces of the PCB. However, any process for plating the PCB can be used.

Figure 3:
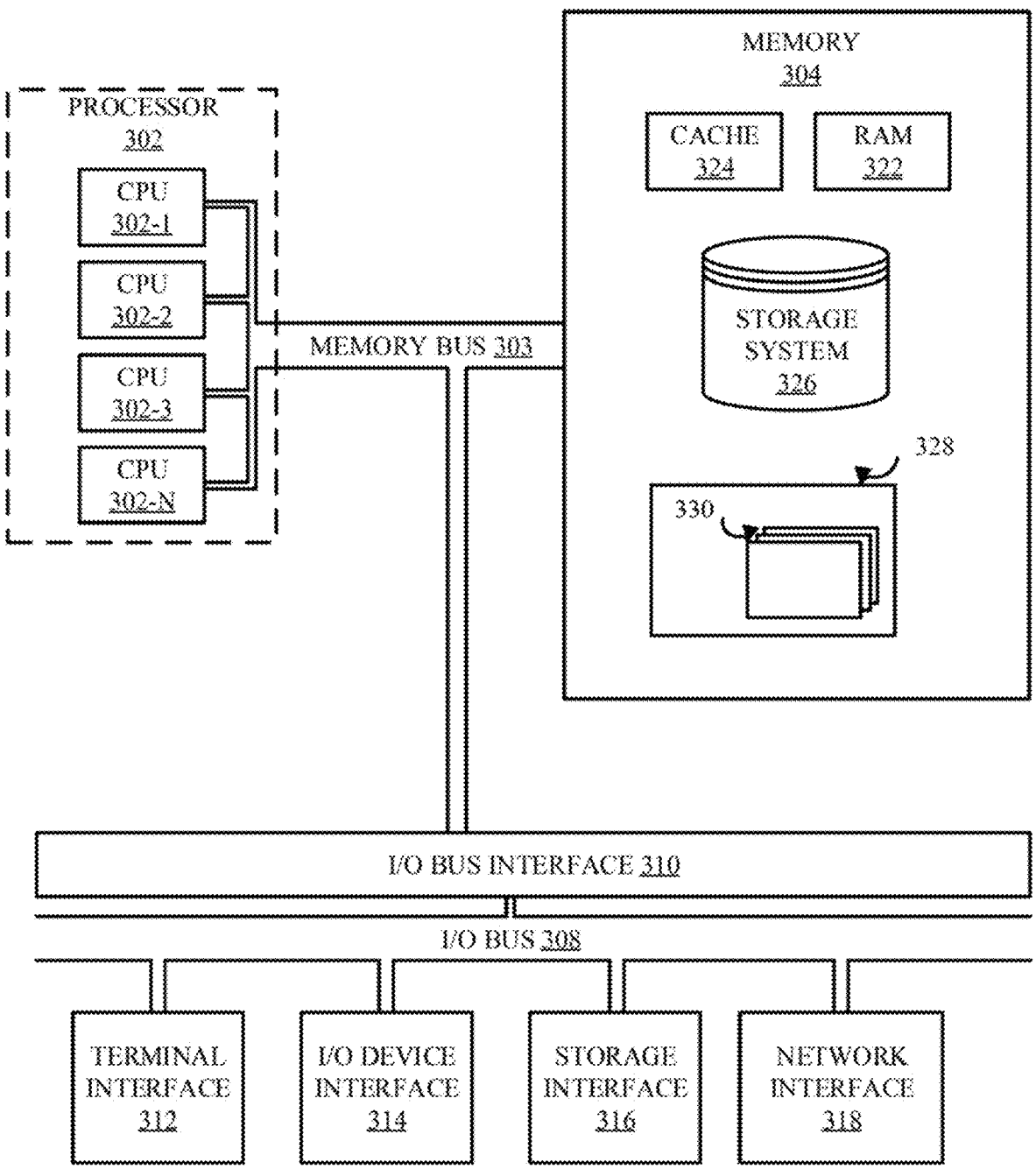
FIG. 3 is a block diagram illustrating a computing system according to one embodiment.

Referring now to FIG. 3, shown is a high-level block diagram of an example computer system 301 that may be used in implementing one or more of the methods, tools, and modules, and any related functions, described herein (e.g., using one or more processor circuits or computer processors of the computer), in accordance with embodiments of the present disclosure. In some embodiments, the major components of the computer system 301 may comprise one or more CPUs 302, a memory subsystem 304, a terminal interface 312, a storage interface 316, an I/O (Input/Output) device interface 314, and a network interface 318, all of which may be communicatively coupled, directly or indirectly, for inter-component communication via 115 a memory bus 303, an I/O bus 308, and an I/O bus interface unit 310.

The computer system 301 may contain one or more general-purpose programmable central processing units (CPUs) 302-1, 302-2, 3023, 302-N, herein collectively referred to as the CPU 302. In some embodiments, the computer system 301 may contain multiple processors typical of a relatively large system; however, in other embodiments the computer system 301 may alternatively be a single CPU system. Each CPU 302 may execute instructions stored in the memory subsystem 304 and may include one or more levels of on-board cache.

System memory 304 may include computer system readable media in the form of volatile memory, such as random access memory (RAM) 322 or cache memory 324. Computer system 301 may further include other removable/non-removable, volatile/non-volatile computer system storage media. By way of example only, storage system 326 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 304 can include flash memory, e.g., a flash memory stick drive or a flash drive. Memory devices can be connected to memory bus 303 by one or more data media interfaces. The memory 304 may include at least one program product having a set (e.g., at least one) of program modules that are configured to carry out the functions of various embodiments.

Although the memory bus 303 is shown in FIG. 3 as a single bus structure providing a direct communication path among the CPUs 302, the memory subsystem 304, and the I/O bus interface 310, the memory bus 303 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 310 and the I/O bus 308 are shown as single respective units, the computer system 301 may, in some embodiments, contain multiple I/O bus interface units 310, multiple I/O buses 308, or both. Further, while multiple I/O interface units are shown, which separate the I/O bus 308 from various communications paths running to the various I/O devices, in other embodiments some or all of the I/O devices may be connected directly to one or more system I/O buses.

In some embodiments, the computer system 301 may be a multi-user mainframe computer system, a single-user system, or a server computer or similar device that has little or no direct user interface, but receives requests from other computer systems (clients). Further, in some embodiments, the computer system 301 may be implemented as a desktop computer, portable computer, laptop or notebook computer, tablet computer, pocket computer, telephone, smart phone, network switches or routers, or any other appropriate type of electronic device.

It is noted that FIG. 3 is intended to depict the representative major components of an exemplary computer system 301. In some embodiments, however, individual components may have greater or lesser complexity than as represented in FIG. 3, components other than or in addition to those shown in FIG. 3 may be present, and the number, type, and configuration of such components may vary.

One or more programs/utilities 328, each having at least one set of program modules 330 may be stored in memory 304. The programs/utilities 328 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Programs 328 and/or program modules 330 generally perform the functions or methodologies of various embodiments.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific drill community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 4:
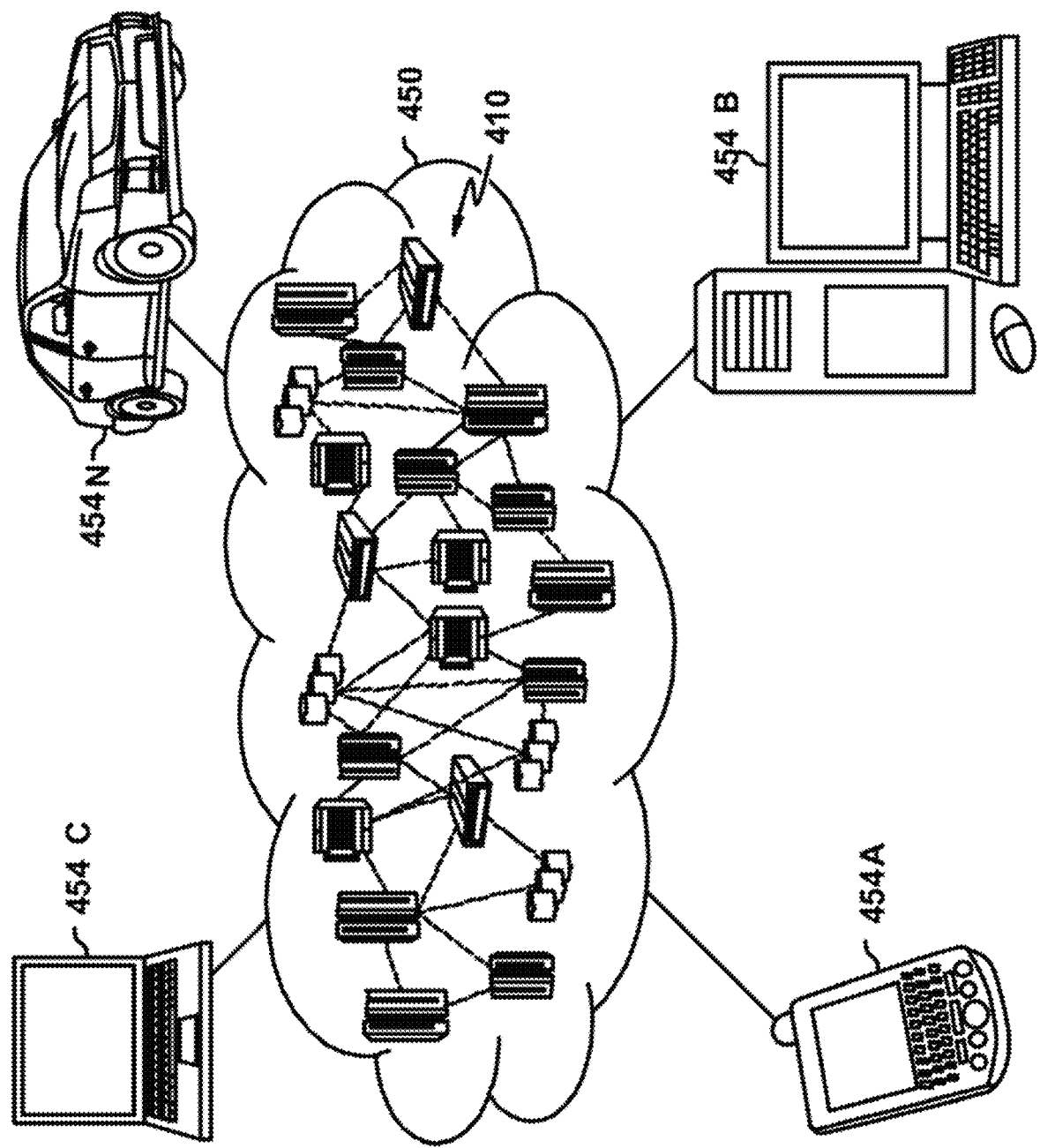
FIG. 4 is a diagrammatic representation of an illustrative cloud computing environment.

The system 450 may be employed in a cloud computing environment. FIG. 4, is a diagrammatic representation of an illustrative cloud computing environment 450 according to one embodiment. As shown, cloud computing environment 450 comprises one or more cloud computing nodes 95 with which local computing devices used by cloud consumers, such as, for example, personal digital assistant (PDA) or cellular telephone 454A, desktop computer 454B, laptop computer 454C, and/or automobile computer system 454N may communicate. Nodes 95 may communicate with one another. They may be grouped (not shown) physically or virtually, in one or more networks, such as Private, Community, Public, or Hybrid clouds as described hereinabove, or a combination thereof. This allows cloud computing environment 450 to offer infrastructure, platforms and/or software as services for which a cloud consumer does not need to maintain resources on a local computing device. It is understood that the types of computing devices 454A-N shown in FIG. 4 are intended to be illustrative only and that computing nodes 5 and cloud computing environment 450 may communicate with any type of computerized device over any type of network and/or network addressable connection (e.g., using a web browser).

Figure 5:
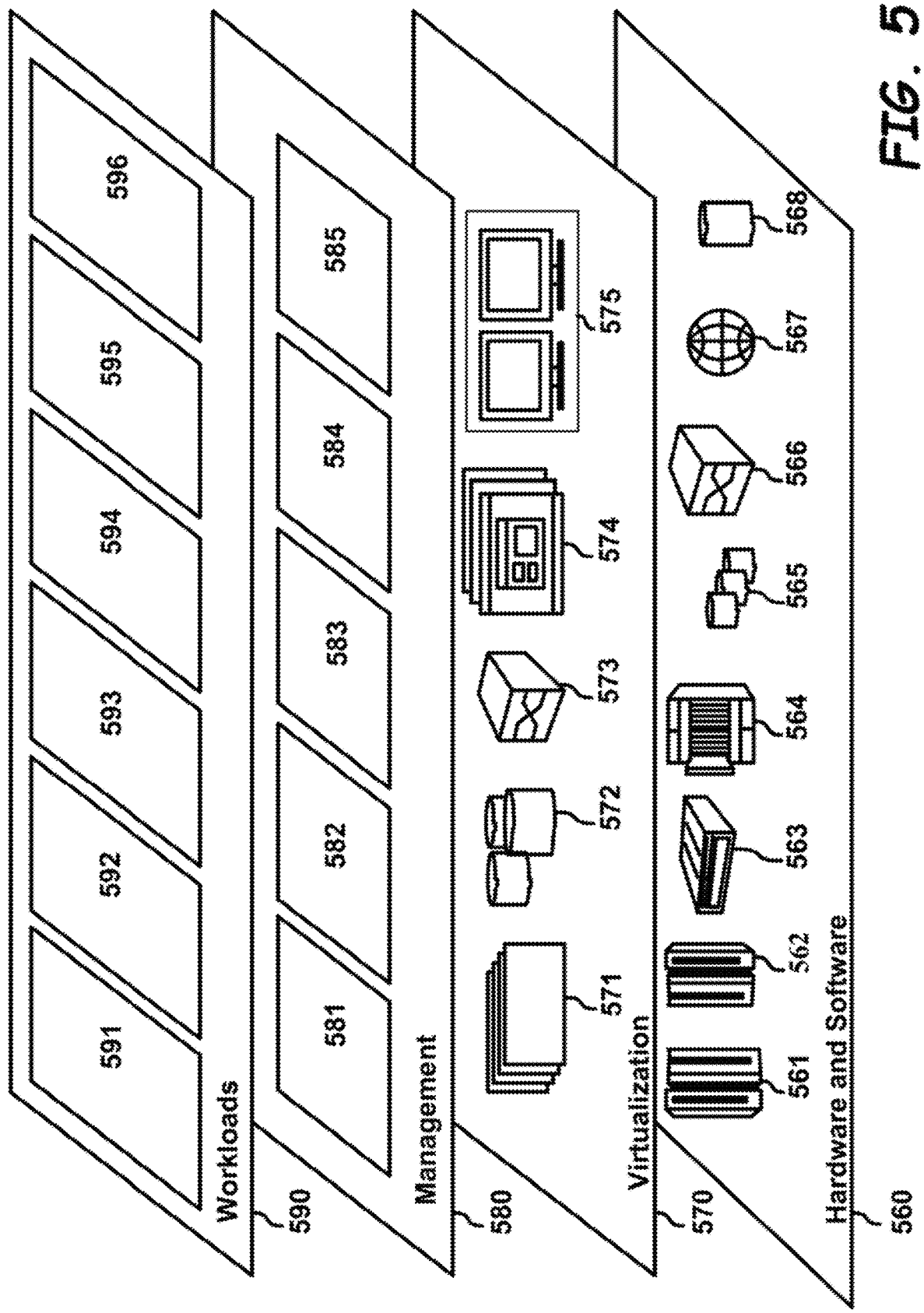
FIG. 5 illustrates a set of functional abstraction layers provided by cloud computing environment according to one illustrative embodiment.

Referring now to FIG. 5, a set of functional abstraction layers provided by cloud computing environment 450 (FIG. 4) is shown. It should be understood in advance that the components, layers, and functions shown in FIG. 5 are intended to be illustrative only and embodiments of the disclosure are not limited thereto. As depicted, the following layers and corresponding functions are provided:

Hardware and software layer 560 includes hardware and software components. Examples of hardware components include: mainframes 561; RISC (Reduced Instruction Set Computer) architecture based servers 562; servers 563; blade servers 564; storage devices 565; and networks and networking components 566. In some embodiments, software components include network application server software 567 and database software 568.

Virtualization layer 570 provides an abstraction layer from which the following examples of virtual entities may be provided: virtual servers 571; virtual storage 572; virtual networks 573, including virtual private networks; virtual applications and operating systems 574; and virtual clients 575.

In one example, management layer 580 may provide the functions described below. Resource provisioning 581 provides dynamic procurement of computing resources and other resources that are utilized to perform tasks within the cloud computing environment. Metering and Pricing 582 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 583 provides access to the cloud computing environment for consumers and system administrators. Service level management 584 provides cloud computing resource allocation and management such that required service levels are met. Service Level Agreement (SLA) planning and fulfillment 585 provide pre-arrangement for, and procurement of, cloud computing resources for which a future requirement is anticipated in accordance with an SLA.

Workloads layer 590 provides examples of functionality for which the cloud computing environment may be utilized. Examples of workloads and functions which may be provided from this layer include: mapping and navigation 591; software development and lifecycle management 592; layout detection 593; data analytics processing 594; transaction processing 595; and database 596.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via 115 a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via 115 the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A system for drilling vias in a printed circuit board comprising:
    a laminated printed circuit board (PCB) having a plurality of layers;
    a drill, the drill including a mechanical drill and a laser drill on a same drill arm; and
    a control unit connected to the drill, the control unit configured to:
        move the mechanical drill over a location of the PCB where a via is desired;
        drill using the mechanical drill to a point where a tip of a bit of the mechanical drill is a predetermined distance above a target interconnect layer;
        move the drill such that the laser drill is located over the via where the mechanical drill had drilled the via; and
        apply the laser drill to ablate resin remaining above the target interconnect layer.

2. The system of claim 1 wherein the drill is configured to rotate the drill arm to switch between the mechanical drill and the laser drill.

3. The system of claim 1 wherein the laser drill uses a $CO_2$ laser.

4. The system of claim 1 wherein the laser drill uses an Yttrium Aluminum Garnet laser.

5. The system of claim 1 wherein the drill further includes a second laser drill.

6. The system of claim 5 wherein the laser drill uses a $CO_2$ laser and the second laser drill uses an Yttrium Aluminum Garnet laser.

7. The system as recited in claim 6, wherein the Yttrium Aluminum Garnet laser cleans a surface of an interconnect layer following a use of the $CO_2$ laser.

8. The system as recited in claim 6, wherein the $CO_2$ laser and the Yttrium Aluminum Garnet laser are different heads of the drill.

9. The system as recited in claim 6, wherein the $CO_2$ laser and the Yttrium Aluminum Garnet laser share a same head of the drill.

10. The system as recited in claim 1, wherein the drill is configured to drill blind vias into the printed circuit board.

11. The system as recited in claim 1, wherein the mechanical drill and the laser drill are attached to the drill arm with a drill platform that is configured to rotate around an axis.

12. The system as recited in claim 11, wherein the drill arm rotates around the axis such that the mechanical drill and the laser drill bore a same hole without needing to move the drill arm to a new position.

13. The system as recited in claim 1, wherein the drill is programmed to move the mechanical drill and the laser drill to a same location above the printed circuit board so that the mechanical drill and the laser drill are able to drill in the same via.

14. The system as recited in claim 1, wherein the drill is configured to move material through spinning action and processing the material through an auger built into the drill.

15. The system as recited in claim 1, wherein the laser drill creates thru-holes by repeatedly pulsing focused laser energy on the printed circuit board.

\* \* \* \* \*